United States Patent [19]

Nakayama et al.

[11] 4,425,563

[45] Jan. 10, 1984

[54] SWITCH CIRCUIT ARRANGEMENT

[75] Inventors: Koichi Nakayama, Hatoyama; Yasuo Fukitani, Sakado, both of Japan

[73] Assignee: Toko, Inc., Tokyo, Japan

[21] Appl. No.: 302,649

[22] Filed: Sep. 15, 1981

[30] Foreign Application Priority Data

Sep. 16, 1980 [JP] Japan .................................. 55-128395

[51] Int. Cl.³ ............................................. G08B 5/36
[52] U.S. Cl. ................... 340/644; 340/365 E; 200/310
[58] Field of Search ........... 340/644, 653, 691, 815.12, 340/815.31, 365 R, 365 E, 365 C, 365 S; 200/312, 310; 179/99 LS, 90 L

[56] References Cited

U.S. PATENT DOCUMENTS

| | | | |
|---|---|---|---|
| 3,986,039 | 10/1976 | Bovitz | 340/365 E |
| 4,092,640 | 5/1978 | Satoh | 200/310 |
| 4,138,613 | 2/1979 | Tanaka | 340/365 E |

FOREIGN PATENT DOCUMENTS 5424675  2/1979  Japan ................................ 340/644

Primary Examiner—Gerald L. Brigance

[57] ABSTRACT

A switch circuit arrangement, wherein a plurality of switch means each comprising paired display lamp and self-restore type switch contact are provided, and a control circuit is also provided in association with said switch means. By actuating any one of the switches, a display lamp paired therewith is lit, and at the same time, a control signal is derived from a detector circuit including I²L element. The control signal thus derived is passed to a controlled device, whereby the display lamp is lit and maintained in the lit state.

4 Claims, 7 Drawing Figures

SWITCH CIRCUIT ARRANGEMENT

BACKGROUND OF THE INVENTION

The present invention relates to a switch circuit arrangement which may be employed for the purpose of controlling audio equipment, digital apparatus or the like, and more particularly it pertains to such a switch circuit arrangement wherein a switch contact and display lamp are paired with each other, and a control signal resulting from actuation of the switch is passed to a controlled device, and at the same time the display lamp is lit and maintained in the lit state.

Recently, in the field of audio equipment, digital apparatus or the like, such an arrangement that switch means each incorporating a switch contact and display lamp are arranged in a control panel, has extensively been employed. With such an arrangement, however, it is required that such switch means be able to perform the function of providing a control signal when it is opened and closed and the function of lighting and maintaining the display lamp in the lit state. Furthermore, it is also required that such switch circuit arrangement be miniaturized as greatly as possible. To this end, the switch circuit arrangement should preferably be fabricated in the form of a semiconductor integrated circuit. Furthermore, a number of switch circuits each comprising a paired display lamp and switch and a control circuit for controlling the switch should be able to be incorporated in a package having a predetermined number of terminal pins. Still furthermore, the switch mechanism should comprise a miniaturized and simplified one which makes it possible to electronically perform various switching functions. In such a case, an interface is required to transmit a control signal derived from mechanical switch contact to a controlled device.

SUMMARY OF THE INVENTION

Accordingly, it is an object of the present invention to provide a switch circuit arrangement including switch means comprising a display lamp constituted by a light emission diode and a self-restore type switch contact which are paired with each other; a drive circuit for the display lamp; a detector circuit for the detecting the opening and closure of the switch; and a memory circuit for storing a control signal resulting from the opening and closure of the switch, wherein the control signal is transmitted to a controlled device and at the same time, the display lamp is thereby turned on.

Another object of the present invention is to miniaturize the aforementioned switch circuit arrangement by using I²L elements and fabricating the arrangement in the form of a semiconductor integrated circuit.

A further object of the present invention is to provide a switch circuit arrangement wherein switch means comprising a display lamp and switch contact which are integrally associated with each other, and a switching circuit are connected with each other through a single signal line so that they can be connected with each other by means of a single terminal pin, thereby making it possible to perform the aforementioned various switching functions as well as to incorporate a number of switching circuits in a package including predetermined terminal pins.

A still further object of the present invention is to provide a switch circuit arrangement wherein switch means comprising a display lamp and self-restore type switch contact is mounted on a control panel or the like; by actuating the switch, the lamp is turned on, and a control signal is derived from a detector circuit including I²L element, the control signal being passed to a controlled device and also to a drive circuit, whereby the display lamp is maintained in the turned-on state.

Other objects, features and advantages of the present invention will become apparent from the ensuing description taken in conjunction with the accompanying drawings.

FIG. 6 is a view showing a further embodiment wherein paired display lamps and switches are arranged on a control panel or the like.

DETAILED DESCRIPTION OF THE INVENTION

Figure 1:
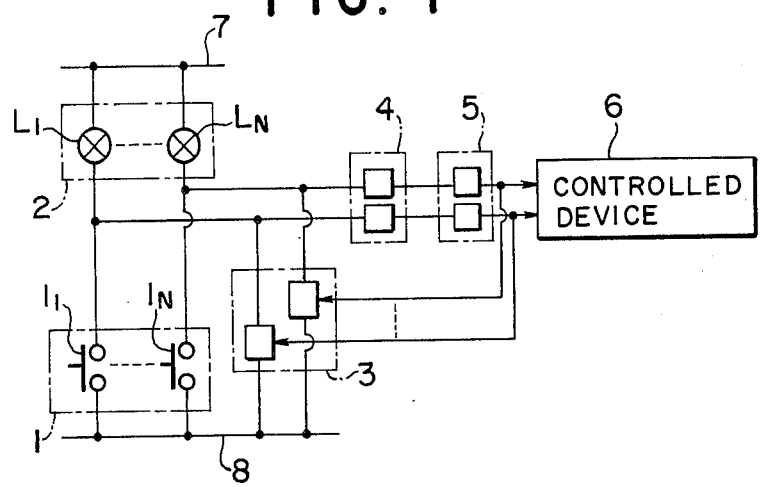
FIG. 1 is a block diagram illustrating a basic form of the switch circuit arrangement embodying the present invention.

Referring first to FIG. 1, there is shown a switching circuit arrangement, which comprises a switch mechanism 1 including switch contacts $1_1$ to $1_N$ of self-restore type switches, a display lamp assembly 2 including display lamps $L_1$ to $L_N$ each of which may be constituted by a light emission diode, a drive circuit 3 for driving the display lamps, and circuits 4 and 5 which are arranged to provide to a controlled circuit 6 a control signal which is obtained when the switch mechanism is opened and closed. The circuit 4 is constituted by a detector circuit, and the circuit 5 is formed by a memory circuit for storing the control signal. Indicated at 7 and 8 are a power source line and ground line, respectively.

The switch 1, which includes self-restore type contacts as mentioned above, is normally in an off state, and designed such that it is maintained in an on state while the push-button thereof is depressed, and returned to the off state upon release of the depression.

The basic operation of the present switching circuit arrangement will now be described. When the push-button of any of the switches is depressed, the display lamp corresponding to the depressed switch is lit, and at the same time, a control signal is passed to the controlled device 6 through the control signal transmission circuits 4 and 5. Upon release of the depression, the depressed switch is enabled to return to the off state, whereas the display lamp remains lit by virtue of the fact that the control signal is also provided to the drive circuit 6 through the memory circuit 5.

Figure 2:
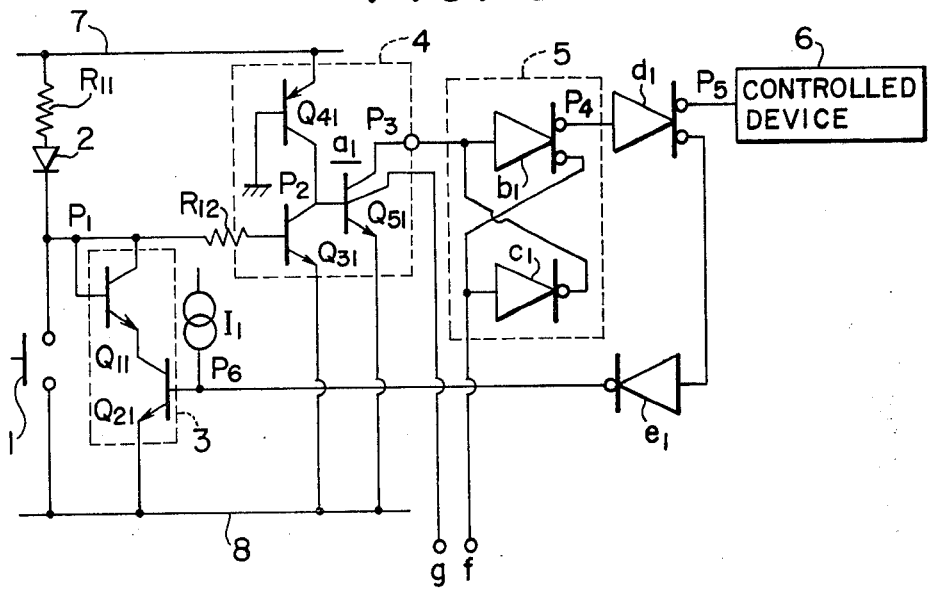
FIG. 2 is a circuit diagram showing the switch circuit arrangement according to an embodiment of the present invention.
Figure 3I:
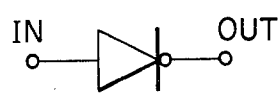
FIG. 3(I) is a view illustrating a symbol mark for I²L element, and FIG. 3(II) is a view showing an equivalent circuit thereof.
Figure 3:
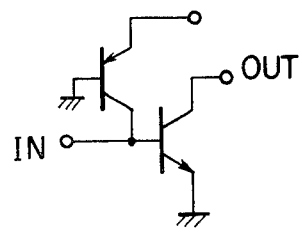

Referring next to FIG. 2, there is shown the switching circuit arrangement according to an embodiment of the present invention. In this embodiment, a resistor $R_1$, light emission diode 2 and switch 1 are connected in series between the power source line 7 and the ground line 8. Connected in parallel with the switch 1 are transistors $Q_{11}$ and $Q_{21}$ which are connected in a diode-like fashion between the ground line 8 and the connection point $P_1$ between the switch 1 and the light emission diode 2. A resistor $R_{12}$ is connected at one end to the point $P_1$, with the other end thereof being coupled to the base of the transistor $Q_{31}$ which has the emitter thereof connected to the ground line 8 and the collector thereof coupled to an input terminal $P_2$ of I$^2$L element $a_1$ comprising transistors $Q_{41}$ and $Q_{51}$. The transistors $Q_{31}$, $Q_{41}$ and $Q_{51}$ constitute the detector circuit 4. The transistors $Q_{41}$ and $Q_{51}$ represent an equivalent circuit of the I$^2$L element. That one of the collectors of the transistor $Q_{51}$ which constitutes the output terminal $P_3$ of the I$^2$L element $a_1$, is coupled to an input terminal of an RS-flip-flop (F/F) which comprises I$^2$L elements $b_1$ and $c_1$. The RS-F/F constituted by the I$^2$L elements $b_1$ and $c_1$ forms the memory circuit 5, wherein an output terminal of the I$^2$L element $b_1$ is coupled to the input terminal of the I$^2$L element $c_1$; the output terminal of the element $c_1$ is connected to the input terminal of the element $b_1$; another output terminal $P_4$ of the element $b_1$ is coupled to the input terminal of I$^2$L element $d_1$; an output terminal $P_5$ of the element $d_1$ is connected to the controlled device 6; and another output terminal of the element $d_1$ is connected to the input terminal of a I$^2$L element $e_1$ the output terminal of which is coupled to the base of the transistor $Q_{21}$. A current source $I_1$ is connected at a point $P_6$ to the base of the transistor $Q_{21}$. A terminal f is an input terminal for a reset signal, and a terminal g is an output terminal which is employed for resetting another switch circuit. A symbol mark for the I$^2$L element is shown in FIG. 3(I), and an equivalent circuit of the I$^2$L element is represented in FIG. 3(II).

The operation of the embodiment shown in FIG. 2 will now be described with reference to FIG. 4 which shows a timing chart. Waveforms occuring at the points $P_1$ to $P_6$ correspond to those shown at $P_1$ to $P_6$ in FIG. 4, respectively. First of all, when the switch 1 is turned off, a small current is flowing in the base of the transistor $Q_{31}$ through the resistor $R_{11}$, light emission diode 2 and resistor $R_{12}$, and the transistor $Q_{31}$ is turned on by drawing in a collector current from the transistor $Q_{41}$. However, the light emission diode 2 is not activated enough to emit light because of the fact that the base current of the transistor $Q_{31}$ is low. At this time, the potential at the point $P_1$ is of an H (high) level, whereas the potential at the point $P_2$ is of an L (low) level. The potentials which occur at the points $P_3$ to $P_6$ initially, are as shown in FIG. 4.

Figure 4:
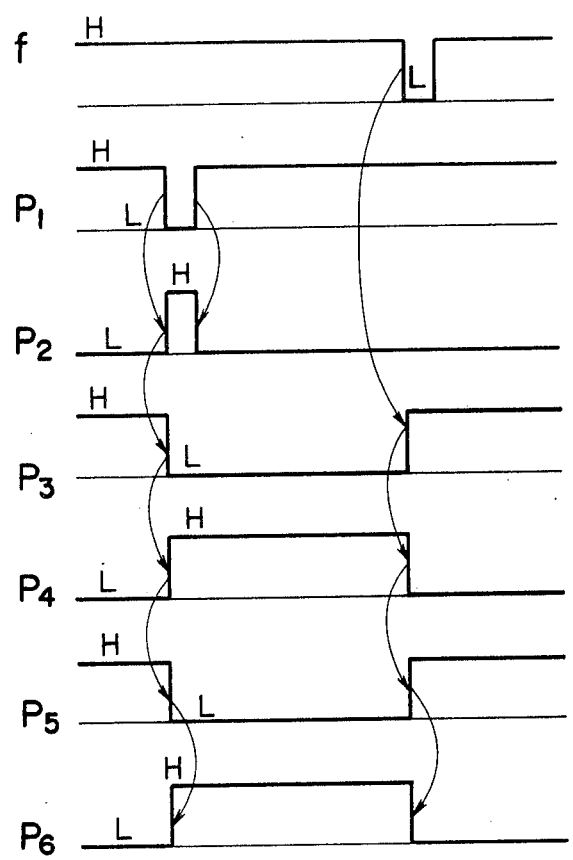
FIG. 4 is a timing chart useful for explaining the operation of the present switch circuit arrangement.

The switch circuit is provided with a reset signal from the terminal f of the memory circuit 5, and the terminal f is at the H level; thus, the switch circuit is in the reset state (FIG. 4f). If it is assumed that the switch 1 is a push-button type switch, then the switch 1 will be turned on by being depressed, so that a current will be caused to flow to the light emission diode 2 through the resistor $R_{11}$, whereby the lamp constituted by the light emission diode 2 will be lit. The potentials which occur at the points $P_1$ to $P_6$ will be described. The potential at the point $P_1$ which serves as input terminal for the detector circuit 4 will be reversed from the H level to the L level by the switch 1 being turned on (FIG. 4$P_1$); the potential at the point $P_2$, i.e., the collector electrode of the transistor $Q_{31}$, since the base current thereof is cut off, will be reversed from the L level to the H level (FIG. 4$P_2$); and the potential at the point $P_3$, i.e., the collector of the transistor $Q_{51}$ (output terminal of the detector circuit 4) will be reversed from the H level to the L level (FIG. 4$P_3$). The point $P_4$ of the I$^2$L element $b_1$ will be reversed from the L level to the H level (FIG. 4$P_4$). The potential at the point $P_4$ will be reversed by the I$^2$L element $d_1$, and the potential at the point $P_5$ will be changed from the H level to the L level so that a control signal will be inputted to the controlled device 6 and an H level signal will be inputted to the base of the terminal $Q_{21}$ through the I$^2$L element $e_1$. When the switch 1 is released from the depression of its push-button, the drive circuit 3 will be activated. Thus, the potential at the point $P_1$ will become equal to the sum of the voltage $V_{BE}$ between the base and the emitter of the transistors $Q_{11}$ and $Q_{21}$ consituting the drive circuit 3 and the voltage $V_{CE}$ between the collector and the emitter thereof, and it will be at the H level high enough to turn on the PNP transistor $Q_{31}$. The potential at the collector electrode point $P_2$ of the transistor $Q_{31}$ will be changed from the H level to the L level by virtue of the fact that the transistor $Q_{31}$ is turned on. The output terminal g of the detector circuit 4 will be reversed from the L level to the H level, while the output terminal $P_3$ will be maintained at the L level since a potential of the H level is applied to the terminal f of the memory circuit 5 constituted by RS-F/F. In this way, the potential at the point $P_4$, i.e., the output terminal of the memory circuit 5 will be held at the H level; thus, the potential at the output terminal $P_5$ of the I$^2$L element $d_1$ will be held at the L level so that a control signal will be continuously transmitted to the controlled device 6. Furthermore, the output terminal $P_6$ of the I$^2$L element $e_1$ will be held at the H level to turn on the display lamp 2.

As shown at f in FIG. 4, when a reset signal of the L level is inputted to the terminal f of the memory circuit 5 formed by RS-F/F, the potential at the output terminal of the I$^2$L element $c_1$ will be reversed to the H level so that the potential at the point $P_3$ will be of the H level (FIG. 4$P_3$). As a result, the output terminal $P_4$ of the I$^2$L element $b_1$ will be reversed from the H level to the L level (FIG. 4$P_4$), whereas the potential at the output terminal $P_5$ of the I$^2$L element $d_1$ will be reversed from the L level to the H level so that the transmission of the control signal to the controlled device 6 will be interrupted. Consequently, the output terminal of the I$^2$L element $e_1$ will now be of the L level so that the drive circuit 3 will be urged into a cut-off state, thus resulting in the light emission diode 2 being stopped from emitting light. In the case where the "on" resistance of the switch 2 is high, it is required that the threshold voltage of the drive circuit 3 comprising the transistors $Q_{11}$ and $Q_{21}$ be made to the high.

Figure 5:
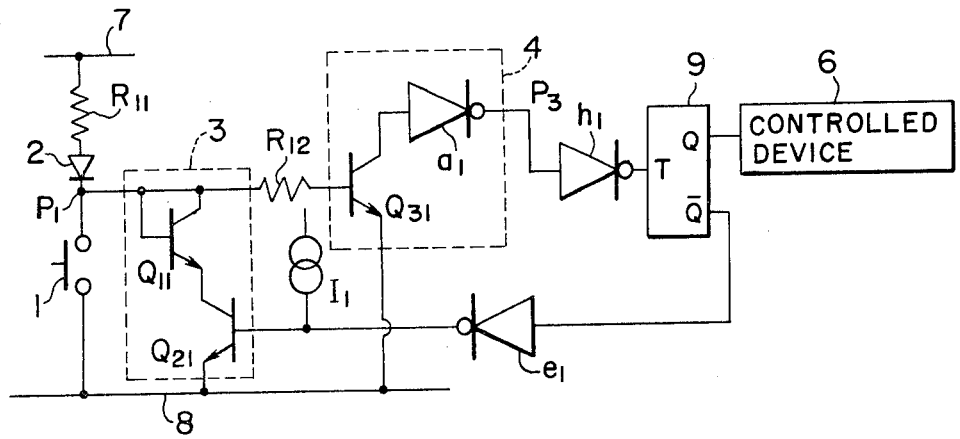
FIG. 5 is a view showing the switch circuit arrangement according to another embodiment of the present invention.

The arrangement according to the embodiment shown in FIG. 2 comprises the single switch and display lamp, and the switch circuit, wherein RS-F/F is used as the memory circuit, the arrangement being designed such that the display lamp which is lit, is turned off by being provided with a reset signal from another switch circuit. Referring to FIG. 5, there is shown the switch circuit arrangement according to another embodiment of the present invention, which is designed such that a display lamp is turned on and off without being provided with a signal from another circuit.

The arrangement shown in FIG. 5 is different from that shown in FIG. 2 in that T-F/F is employed as memory circuit. In this embodiment, by depressing the push-button of a switch 1, the output terminal $P_3$ of a detector circuit 4 is reversed from the H level to the L level, whereas by releasing the switch 1 from the depression of its push-button, the potential at the output terminal $P_3$ is reversed from the L level to the H level.

A resultant signal will be inputted to a I²L element $h_1$ to cause the output thereof to be reversed, and the output thus reversed will be inputted to a terminal T of T-F/F 9. Consequently, the potential at a terminal Q of the memory circuit comprising T-F/F will be reversed from the L level to the H level, so that a control signal will be applied to a controlled device 6. Furthermore, the potential at the terminal $\overline{Q}$ will be reversed from the H level to the L level so that a potential of the H level will be applied to a drive circuit 3 through I²L element $e_1$, whereby a display lamp 2 will be lit. By depressing again the push-button of the switch 1 to input a signal to the terminal T of T-F/F thereby releasing the previously stored state, the potential at the terminal Q of T-F/F will be reversed from the H level to the L level, while the potential at terminal $\overline{Q}$ will be reversed from the L level to the H level. Consequently, the potential at the terminal $\overline{Q}$ will be reversed from the H level to the L level by the I²L element $e_1$, so that the drive circuit 3 will be changed from an active state to an inactive state, thus resulting in the display lamp 2 being turned off. In this way, according to the embodiment of FIG. 2, the display lamp can be turned on and off individually by means of the switch.

Figure 6:
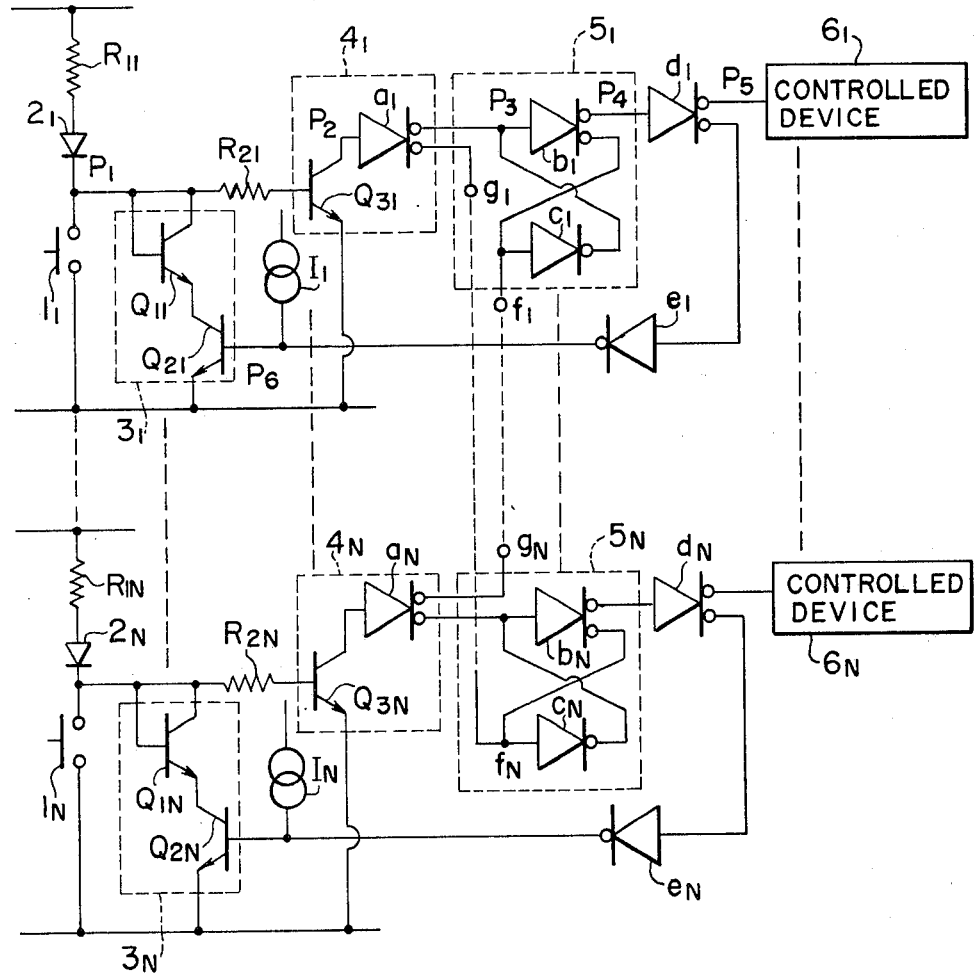

Referring to FIG. 6, there is shown a further embodiment wherein a plurality of switch assemblies each comprising a switch and display lamp are arrayed in a control panel or the like, and a selector circuit is provided in the switch circuit. According to this embodiment, by lighting one of the display lamps, the remaining display lamps will be turned off, and by lighting one of the remaining display lamps, the display lamps which are lit, will be turned off.

In operation, when a display lamp $2_1$ is lit, a control signal of the L level will be inputted to the controlled device 6, so that the display lamp $2_N$ will be in a lit state. At this time, a signal of the H level is being inputted from terminal $g_N$ of I²L element $a_N$ to input terminal $f_1$ of RS-F/F constituting a memory circuit $5_1$, and even if the output of the I²L element $a_1$ is made to be of the H level by the output of the memory circuit 5, the output of I²L elements $b_1$ will be held at the H level. In this way, a control signal of the L level will be continuously supplied to controlled device $6_1$. By depressing the push-button of the switch $1_N$, however, the display lamp $2_N$ will be lit, and a control signal will be inputted to the controlled device $6_N$. At this time, a control signal will be provided by the detector circuit $4_N$; the control signal of the L level (reset signal) will be supplied from the terminal $g_N$ to the terminal $f_1$ of RS-F/F; the potential at the output terminal $P_4$ of the I²L element $b_1$ will thereby be reversed from the H level to the L level; and thus the display lamp $2_1$ will be turned off. The operation described just above is similar to the operation described with reference to FIG. 2. As mentioned above, in the embodiment of FIG. 6, a control signal of the L level will uninterruptedly be supplied to the controlled device $6_1$, so that the display lamp $2_1$ will be lit without interruption, until a reset signal is inputted from another switch circuit to the terminal $f_1$ of RS-F/F.

As will be appreciated from the foregoing explanation, the switch circuit arrangement embodying the present invention is characterized in that when the switch is in an off state, a small current is supplied to the base of the NPN transistor provided at the input stage of I²L element constituting the detector circuit so that the NPN transistor is thereby rendered conductive; and the NPN transistor is turned on or off according to whether the switch is opened or closed, so that a control signal is derived from the I²L element and at the same time the drive circuit is activated, thereby the display lamp is lit and maintained in the lit state. Another important advantage of the present switch circuit arrangement is such that various switching functions can be achieved by virtue of the fact that a memory circuit comprising RS-F/F or T-F/F is incorporated.

Furthermore, according to the present invention, when the switch is operated, the display lamp is activated by the drive circuit, and at the same time the detector circuit is reversed by a signal derived from the drive circuit, as a result of which a control signal is obtained. In this way, the lighting of the display lamp comprising a light emission diode and the derivation of the control signal can be achieved at the same time. Thus, the pair of display lamp and switch and the switch circuit can be connected at one terminal to each other. With such an arrangement, it is possible to incorporate a number of switch circuits in a package, so that the switch circuit arrangement can be miniaturized.

Still furthermore, fabrication of the present switch circuit arrangement in the form of a semiconductor integrated circuit is facilitated by virtue of the fact that it is constituted by a logical circuit comprising I²L element and NPN or PNP transistor, which advantageously leads to further miniaturization of the present switch circuit arrangement.

While the present invention has been described and illustrated with respect to specific embodiments thereof, it is to be understood that the present invention is by no means limited to such specific embodiments but includes and covers all changes and modifications which become possible within the scope of the appended claims.

What is claimed is:

1. A switch circuit arrangement comprising at least one display lamp comprising a light emission diode; at least one switch provided with a self-restore type switch contact; said display lamp and said switch being connected in series with each other; a drive circuit for driving said display lamp, said drive circuit being connected in parallel between the connection point between said switch contact and said display lamp and the other end of said switch contact; a detector circuit comprising an I²L element and transistor provided at the input side thereof, the collector of the transistor being connected to the input terminal of said I²L element, said detector circuit being provided at the base thereof with potential variations resulting from the opening and closure of said switch, thereby detecting the actuation of the switch; and a memory circuit comprising an I²L element for storing a control signal derived from said detector circuit, wherein said control signal is transmitted to a controlled device as well as to said drive circuit, whereby said display lamp is lit and maintained in the lit state.

2. A switch circuit arrangement according to claim 1, wherein there are arranged a number of switches each of which is associated with a switching circuit; when any desired one of said switches is turned on, the display lamp corresponding thereto is lit; and a reset signal is provided from the memory circuit associated with said turned-on switch to another switching circuit, whereby said display lamp is turned off.

3. A switch circuit arrangement according to claim 1, wherein said memory circuit is constituted by a flip-flop comprising first and second I²L elements, the input terminal of said first I²L element being connected to the output terminal of said second I²L element, a first output terminal of said first I²L element being connected to the input terminal of said second I²L element, wherein a reset signal is inputted to the input terminal of said second I²L element, and an output is derived from a second output terminal of said first I²L element.

4. A switch circuit arrangement according to claim 1, wherein said switch is associated with a switching circuit; by actuating said switch, said display lamp is lit, and a control signal resulting from the actuation of said switch is stored in said memory circuit; and by actuating said switch again, a further control signal is obtained which in turn is inputted to said memory circuit to cause the output thereof to be reversed, thereby turning off said display lamp.

* * * * *